(12) United States Patent
Garg et al.

(10) Patent No.: US 8,253,437 B2
(45) Date of Patent: Aug. 28, 2012

(54) REDUCTION OF SIGNAL SKEW

(75) Inventors: Paras Garg, Noida (IN); Saiyid Mohammad Irshad Rizvi, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/106,982

(22) Filed: May 13, 2011

(65) Prior Publication Data

US 2012/0086469 A1 Apr. 12, 2012

Related U.S. Application Data

(63) Continuation of application No. 12/347,199, filed on Dec. 31, 2008, now abandoned.

(51) Int. Cl.
*H03K 17/16* (2006.01)
*H03K 19/003* (2006.01)

(52) U.S. Cl. ............ 326/21; 326/82; 327/170; 327/172; 375/350; 375/371

(58) Field of Classification Search ................ 326/21, 326/22, 82, 93; 327/170, 551, 72; 375/318, 375/350, 371
See application file for complete search history.

(56) References Cited

U.S. PATENT DOCUMENTS

| | | | |
|---|---|---|---|
| 5,119,404 A | 6/1992 | Aihara | |
| 2009/0167363 A1* | 7/2009 | Garg et al. | 327/72 |
| 2012/0086469 A1* | 4/2012 | Garg et al. | 326/21 |

* cited by examiner

*Primary Examiner* — Daniel D Chang
(74) *Attorney, Agent, or Firm* — Wolf, Greenfield & Sacks, P.C.

(57) ABSTRACT

Skew is reduced by extracting the AC component of an input signal and superimposing it on a common reference voltage to produce a resulting voltage. The resulting voltage is provided as an input to a comparator, which compares it to the reference voltage to provide a final output. Thus, all signals fed to a system, in accordance with an embodiment, are referenced at the same DC level and hence, skew is reduced.

11 Claims, 5 Drawing Sheets

REDUCTION OF SIGNAL SKEW

CROSS REFERENCE TO RELATED APPLICATIONS

This application is a continuation of U.S. application Ser. No. 12/347,199 filed Dec. 13, 2008 entitled "Reduction Of Signal Skew" which application is hereby incorporated by reference to the maximum extent allowable by law.

BACKGROUND OF THE INVENTION

1. Field of the Invention

The present disclosure relates to reduction of signal skew and more specifically to reduction of signal skew in memory interfaces.

2. Discussion of the Related Art

Receiver sections in memory interfaces comprise clock/strobe pads and data receiver pads. For efficient functioning of the receiver section, outputs of the clock/strobe pads and data receiver pads should be closely matched. However, the clock/strobe pads are fully differential in nature while the data receiver pads are pseudo differential. This results in skew between the two pads due to which performance is compromised.

Generally, the receiver in clock/strobe pads consists of a differential comparator at the first stage receiving two complementary signals. The receiver in the data receiver pads also consists of a differential comparator receiving a data signal as one input and a reference voltage as second input.

According to conventional art, to ensure effective matching between the outputs of the clock/strobe pads and the data receiver pads, the same differential comparator is used for both clock pads and data receiver pads. However, the characteristics of clock/strobe pads do not completely match the characteristics of data receiver pads owing to the fact that clock/strobe pads are fully differential while data receiver pads are pseudo differential.

Further, the mean voltage levels of the fully differential signal of clock/strobe pads and the pseudo differential signal of data receiver pads are not equivalent to the reference voltage which causes common mode errors.

BRIEF DESCRIPTION OF DRAWINGS

Features and aspects of various embodiments of the disclosure will be better understood when the following detailed description is read with reference to the accompanying drawings in which like characters represent like parts throughout the drawings.

DETAILED DESCRIPTION

Figure 1:
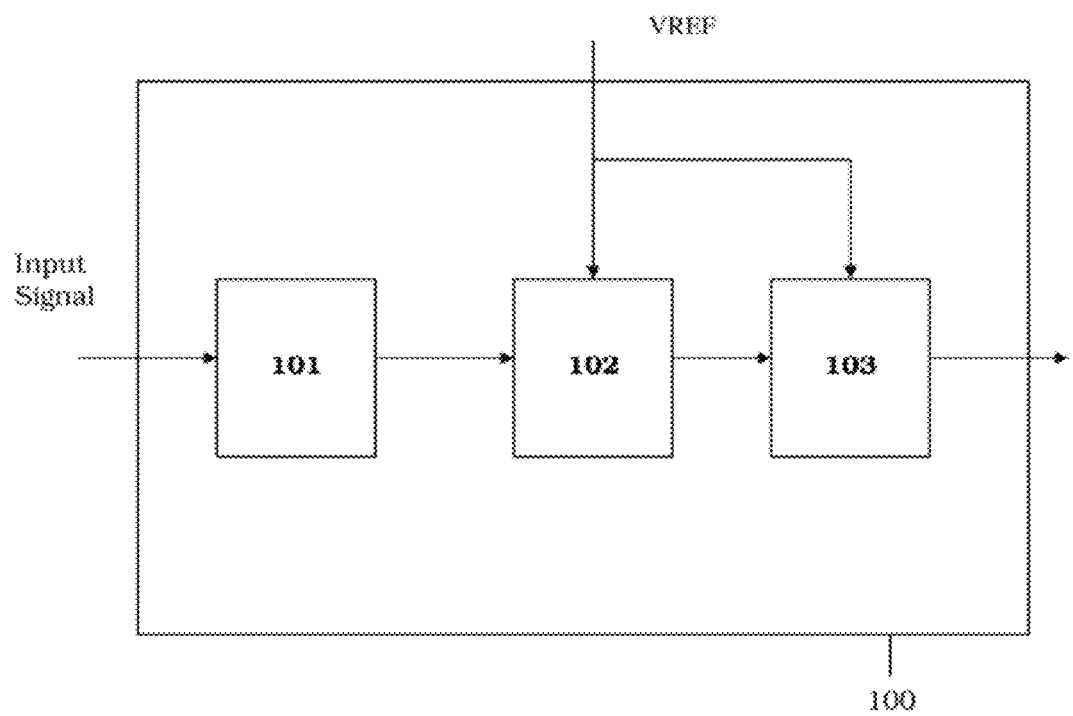
FIG. 1 illustrates a block diagram of a system for reduction of signal skew according to an embodiment of the present disclosure.

The embodiments of the present disclosure will be described in detail with reference to the accompanying drawings. However, the present disclosure is not limited to the illustrated embodiments. The present disclosure can be modified in various forms. The embodiments of the present disclosure are only provided to explain more clearly the present disclosure to the ordinarily skilled in the art of the present disclosure. In the accompanying drawings, like reference numerals are used to indicate like components.

The embodiments of the present disclosure describe reduction of skew between clock/strobe pads and data receiver pads in memory interfaces. A system in accordance with an embodiment of the present disclosure comprises an extraction module coupled to a superimposing module further coupled to a comparator. The extraction module extracts the AC component of an input signal by blocking the DC component and provides the extracted AC component as an input to the superimposing module. The superimposing module superimposes the AC component on a common reference voltage to provide a resulting signal which is then compared to the reference voltage by the comparator. This ensures that all signals are at the same level, thereby reducing the signal skew.

FIG. 1 illustrates the block diagram of a system for reduction of signal skew according to an embodiment of the present disclosure. The system 100 includes an extraction module 101 to extract the AC component of an input signal. The embodiment also comprises a superimposing module 102 and a comparator 103. The extracted AC component of the input signal is superimposed on a common reference voltage VREF to provide a resulting signal. The resulting signal is then input to the comparator 103 for comparing it with the reference voltage to provide a final output which is input to a differential operational amplifier. Thus, all signals received from the system described above are at the same reference levels, thus, there are no matching issues and skew is effectively reduced.

Figure 2:
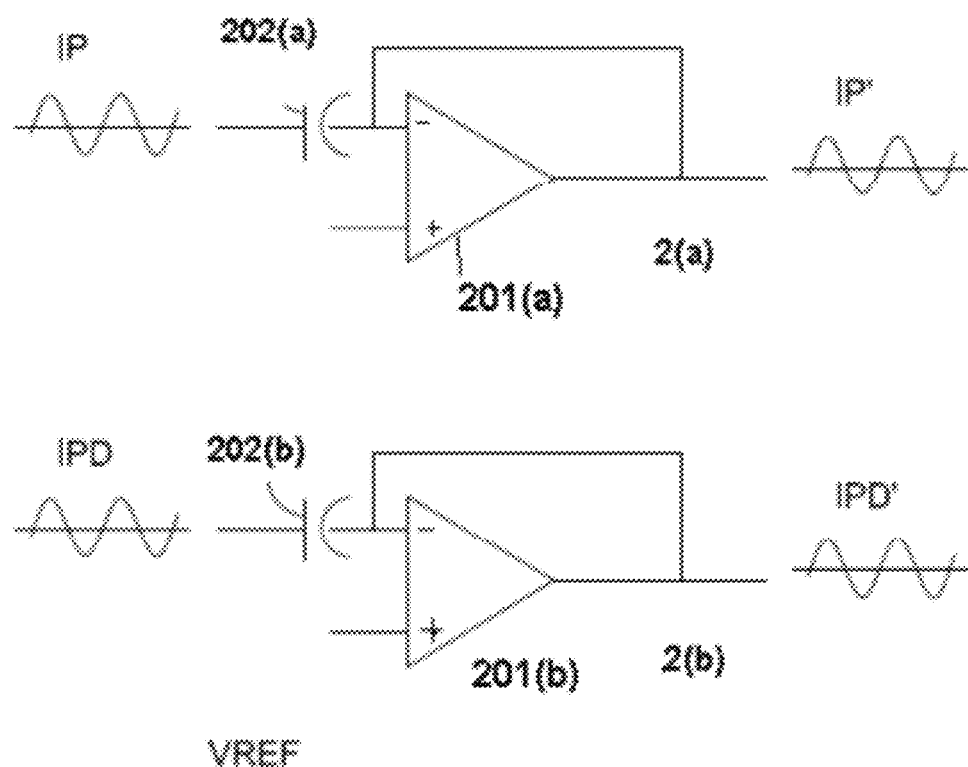
FIG. 2 illustrates extraction of the AC component of an input signal and superimposition on a common reference voltage according to an embodiment of the present disclosure.

FIGS. 2(a) and 2(b) illustrate extraction of the AC component of an input signal and superimposition of extracted AC component on a common reference voltage according to an embodiment of the present disclosure. The present embodiment of the disclosure is directed at clock pads and data receiver pads in the receiver section of a memory interface, the input signal comprises a clock signal and a data signal i.e. IP and IPD respectively.

Figure 3:
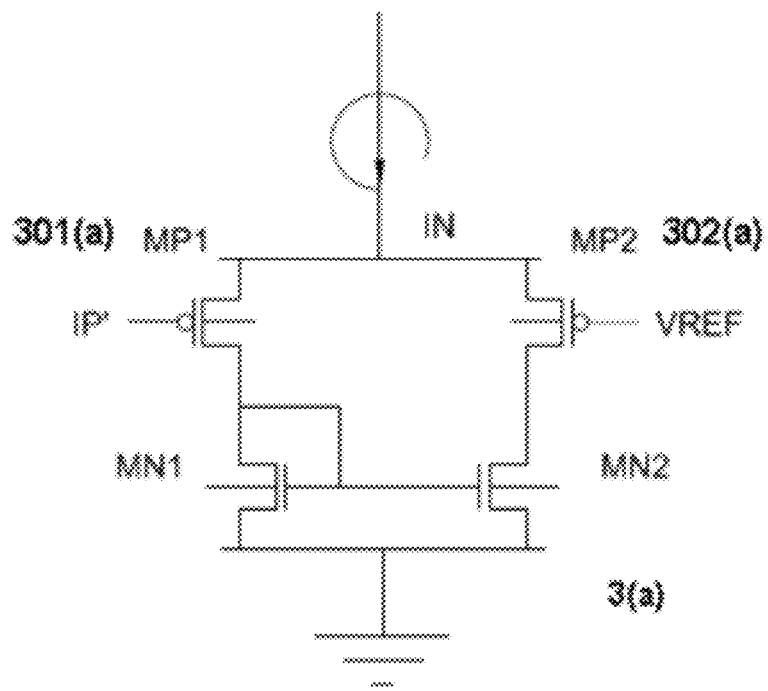
FIG. 3 illustrates a transistor level representation for reduction of signal skew according to an embodiment of the present disclosure.
Figure 3:
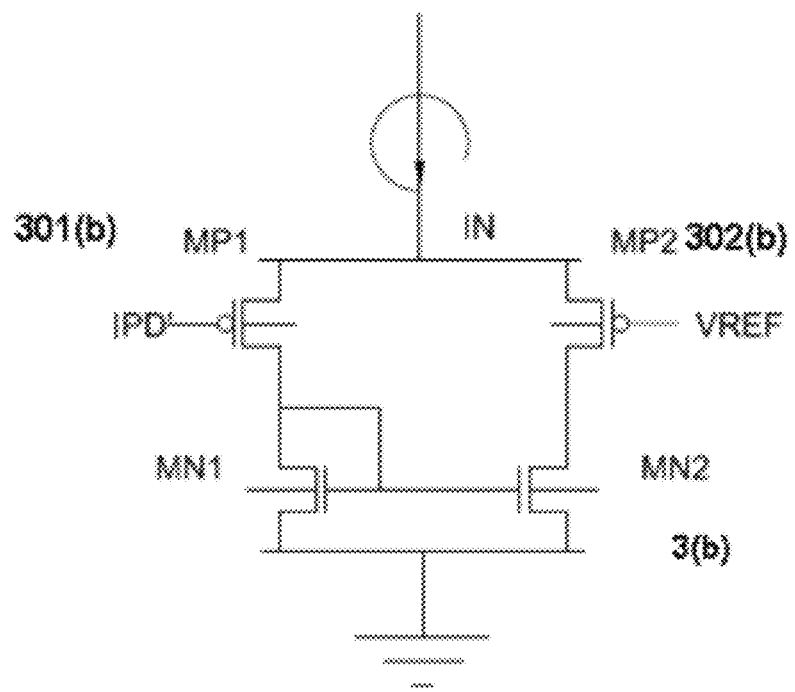

Capacitors 202(a), 202(b) block the DC level of the incoming signal (IP, IPD) but allow the transient signal to pass through. Thus, the AC level from the incoming signal (IP, IPD) is extracted. The extracted signal is then applied as one input to a summing amplifier 201(a), 201(b), which receives reference voltage VREF as the second input. The extracted signal is then superimposed on the common reference voltage to produce a resulting signal (IP', IPD'). All resulting signals are referenced to the same DC level and are applied as an input to a differential operational amplifier. This has been further illustrated in FIG. 3. The resulting signal (IP', IPD') is applied as an input to MP1 (301(a), 301(b)) of the differential operational amplifier while maintaining gate of MP2 (302(a), 302(b)) at reference voltage VREF even for a clock signal. Thus, both signals are identical and hence skew is dramatically reduced.

The generation of the resulting signal by superimposition of the AC level on the common reference voltage helps avoid any common mode errors arising due to mismatch of signals with the reference voltage.

Figure 4:
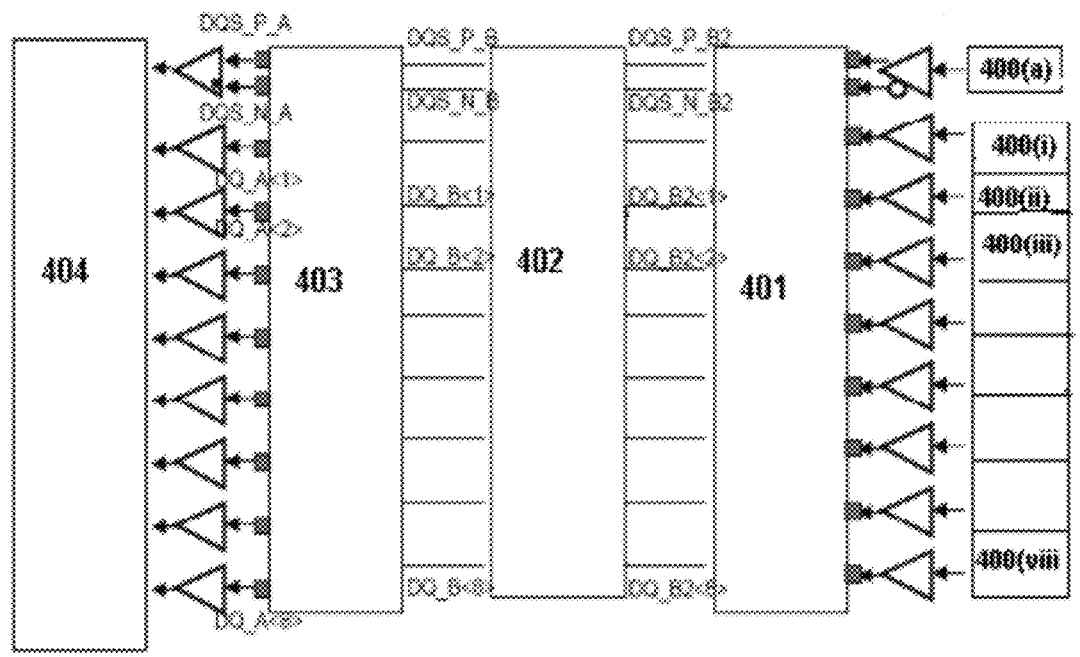
FIG. 4 shows a DDR/SSTL memory interface in accordance with an example of an embodiment of the present disclosure.

Example of an Embodiment in Accordance with the Present Disclosure:

FIG. 4 illustrates a DDR/SSTL memory interface in accordance with an example of an embodiment of the present disclosure. SSTL is an electrical interface used with the DDR memory standard. It comprises a receiver section 403 coupled to a transmission section 401 through an interconnect unit 402. As is shown in the figure, there is one clock driver receiver (analogous to clock/strobe pads) with corresponding signals DQS_P_A and DQS_N_A and eight data driver receivers (analogous to data receiver pads) with corresponding signals DQ_A<1:8>. In a typical DDR based architecture, the transmission section receives clock pattern through 400 (*a*) and data patterns through 400(*i*) to 400(*viii*). DQS_P_A and DQS_N_A have different mean values compared to DQ_A<1:8>. This results in different common mode voltages for the two cases. Assuming that average of voltage levels of DQS_P_A and DQS_N_A i.e. (Vip+Vin)/2 is less than $V_{IPD}$. Thus, a bigger gain and small delay is achieved owing to higher $V_{GS}$ in case of differential inputs while the reverse is true for when the average of DQS_P_A and DQS_N_A is greater than VIPD. The difference arising in the two cases is removed in the present embodiment by applying signal DQS_P_A, DQS_N_A and DQ_A<1:8> to a skew reduction unit 404. The skew reduction unit produces signals which are referenced at the same DC level and are then applied as an input to the differential operational amplifier.

Figure 5:
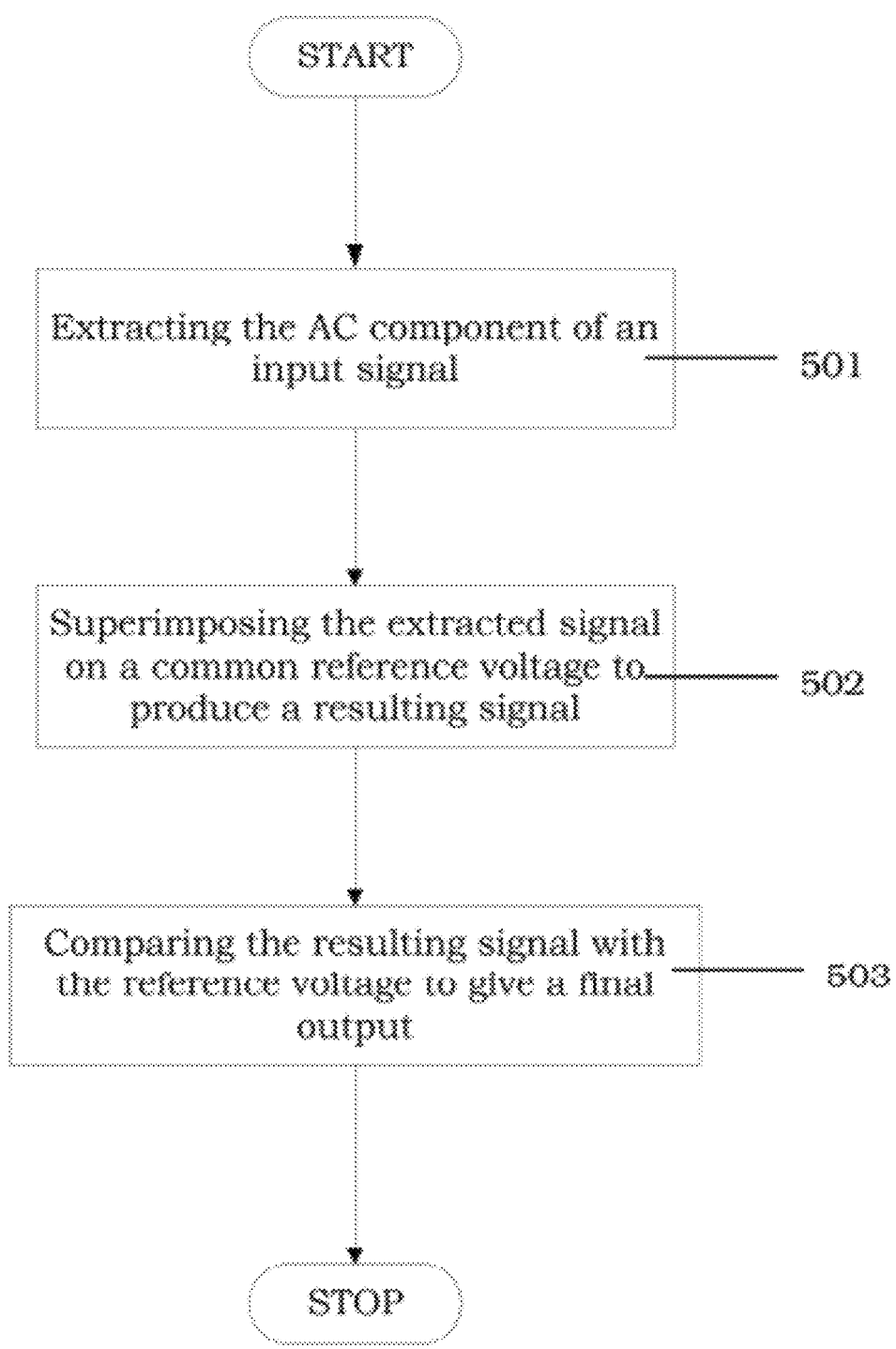
FIG. 5 illustrates a method for reduction of signal skew according to an embodiment of the present disclosure.

An embodiment of method of reduction of signal skew is illustrated in FIG. 5. The method is illustrated as a collection of blocks in a logical flow graph, which represents a sequence of operations that can be implemented in hardware, software, or a combination thereof. The order in which the process is described is not intended to be construed as a limitation, and any number of the described blocks can be combined in any order to implement the process, or an alternate process.

FIG. 5 illustrates a method for reduction of skew between a clock buffer and data buffers according to an embodiment of the present disclosure. At step 501, the AC component of an input signal is extracted and the extracted signal is superimposed on a common reference voltage to produce a resulting signal 502. At step 503, the resulting signal is compared with the reference voltage to give a final output. The output received from the method results in all signals being referenced at the same voltage level thus, efficient matching is achieved and skew is reduced.

According to yet another embodiment of the present disclosure, a skew reduction device is provided. The device comprises an extraction module, a superimposing module and a comparator. The extraction module extracts the AC component of an input signal and provides it as an input to the superimposing module. The superimposing module superimposes the extracted AC component on a common reference voltage to produce a resulting signal which after comparison with the reference voltage is provided as the final output. In an embodiment, the extraction module is a capacitor which blocks DC component while the superimposing module is a summing amplifier.

The reduced signal skew in the embodiments of the present disclosure ensures efficient clock calibration when desired. Further, the embodiments of the present disclosure help reduce signal skew between clock/strobe pads and data receiver pads in receiver sections of memory interfaces.

Although the disclosure of system and method has been described in connection with the embodiment of the present disclosure illustrated in the accompanying drawings, it is not limited thereto. It will be apparent to those skilled in the art that various substitutions, modifications and changes may be made thereto without departing from the scope and spirit of the disclosure.

We claim:
1. A system for reduction of signal skew comprising:
an extraction module for extracting the AC component of an input signal;
a superimposing module coupled to the extraction module for superimposing the extracted AC component of the input signal on a common reference voltage to produce a resulting signal; and
a comparator module coupled to the superimposing module for comparing the resulting signal with the common reference voltage to give a final output.

2. A system as claimed in claim 1, wherein the extracting module comprises a capacitor for blocking a DC component of the input signal.

3. A system as claimed in claim 1 wherein the superimposing module comprises a summing amplifier for superimposing the extracted AC component of the signal.

4. A skew reduction device comprising:
an extraction module for extracting an AC component of an input signal;
a superimposing module coupled to the extraction module for superimposing the extracted AC component of the input signal on a common reference voltage to produce a resulting signal; and
a comparator module coupled to the superimposing module for comparing the resulting signal with the common reference voltage to give a final output.

5. A skew reduction device as claimed in claim 4, wherein the extracting module comprises a capacitor for blocking a DC component of the input signal.

6. A skew reduction device as claimed in claim 4 wherein the superimposing module comprises a summing amplifier for superimposing the extracted AC component of the signal.

7. A DDR/SSTL memory interface comprising:
a. a transmission unit;
b. an interconnect unit;
c. a receiver unit coupled to the transmission unit through said interconnect unit;
d. a skew reduction unit coupled to output of the receiver unit comprising:
i. an extraction module for extracting an AC component of an input signal;
ii. a superimposing module coupled to the extraction module for superimposing the extracted AC component of the input signal on a common reference voltage to produce a resulting signal; and
iii. a comparator module coupled to the superimposing module for comparing the resulting signal with the common reference voltage to give a final output.

8. A DDR/SSTL memory interface as claimed in claim 7, wherein the extracting module comprises a capacitor for blocking a DC component of the input signal.

9. A DDR/SSTL memory interface as claimed in claim 7 wherein the superimposing module comprises a summing amplifier for superimposing the extracted AC component of the signal.

10. A method for reduction of skew in memory interfaces comprising:
a. extracting the AC component of an input signal;
b. superimposing the extracted AC component on a common reference voltage to produce a resulting signal; and
c. comparing the resulting signal with the common reference voltage to give a final output.

11. A method as claimed in claim 10 wherein extracting the AC component of an input signal comprises blocking a DC component of the input signal by a capacitor.

* * * * *